(12) United States Patent
Schmidt et al.

(10) Patent No.: US 11,926,775 B2
(45) Date of Patent: *Mar. 12, 2024

(54) NARROW BAND EMITTING SIAION PHOSPHOR

(71) Applicant: LUMILEDS LLC, San Jose, CA (US)

(72) Inventors: Peter Josef Schmidt, Aachen (DE); Philipp-Jean Strobel, Aachen (DE); Volker Weiler, Aachen (DE); Andreas Tücks, Aachen (DE)

(73) Assignee: Lumileds LLC, San Jose, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 17/781,528

(22) PCT Filed: Dec. 4, 2020

(86) PCT No.: PCT/US2020/063385
§ 371 (c)(1),
(2) Date: Jun. 1, 2022

(87) PCT Pub. No.: WO2021/113692
PCT Pub. Date: Jun. 10, 2021

(65) Prior Publication Data
US 2023/0002671 A1    Jan. 5, 2023

Related U.S. Application Data

(63) Continuation of application No. 17/110,080, filed on Dec. 2, 2020, now Pat. No. 11,453,821.
(Continued)

(30) Foreign Application Priority Data

Jan. 10, 2020 (EP) ..................... 20151188

(51) Int. Cl.
*C09K 11/77* (2006.01)
*C01B 21/082* (2006.01)
(Continued)

(52) U.S. Cl.
CPC ...... *C09K 11/0883* (2013.01); *C01B 21/0826* (2013.01); *C09K 11/77348* (2021.01); *H01L 33/502* (2013.01); *C01P 2006/60* (2013.01)

(58) Field of Classification Search
CPC ................................. C09K 11/7734
See application file for complete search history.

(56) References Cited

U.S. PATENT DOCUMENTS 9,110,355 B1 *  8/2015  Nourbakhsh .......... G03B 15/05
9,546,319 B2     1/2017  Schmidt et al.
(Continued)

FOREIGN PATENT DOCUMENTS

JP    2012524141 A    10/2012
JP    2015526532 A     9/2015
(Continued)

OTHER PUBLICATIONS

Hoerder. Sr(Li2AL2O2N2): Eu2+—A high performance red phosphor to brighten the future. Nat Commun. 2019. 10: 1824. Published online Apr. 23, 2019 (Year: 2019).*
(Continued)

*Primary Examiner* — Matthew E. Hoban

(57) ABSTRACT

This specification discloses methods of enhancing the stability and performance of $Eu^{2+}$ doped narrow band red emitting phosphors. In one embodiment the resulting phosphor compositions are characterized by crystallizing in ordered structure variants of the $UCr_4C_4$ crystal structure type and having a composition of $AE_{1-x}Li_{3-2y}Al_{1+y-z}Si_z O_{4-4y-z}N_{4y+z}:Eu_x$ (AE=Ca, Sr, Ba, or a combination thereof, $0<x<0.04$, $0\leq y<1$, $0<z<0.05$, $y+z\leq 1$). It is believed that the
(Continued)

formal substitution $(Al,O)^+$ by $(Si,N)^+$ reduces the concentration of unwanted $Eu^{3+}$ and thus enhances properties of the phosphor such as stability and conversion efficiency.

20 Claims, 15 Drawing Sheets

Related U.S. Application Data

(60) Provisional application No. 62/944,025, filed on Dec. 5, 2019.

(51) Int. Cl.
*C09K 11/08* (2006.01)
*H01L 33/50* (2010.01)

(56) References Cited

U.S. PATENT DOCUMENTS

| | | | |
|---|---|---|---|
| 11,230,664 B2 | 1/2022 | Baumann et al. | |
| 11,453,821 B2* | 9/2022 | Schmidt | H01L 33/502 |
| 2003/0189829 A1* | 10/2003 | Shimizu | F21V 29/70 |
| | | | 362/240 |
| 2006/0033081 A1* | 2/2006 | Hintzen | C04B 35/6265 |
| | | | 252/301.4 F |
| 2012/0037941 A1* | 2/2012 | Schmidt | C01B 21/0602 |
| | | | 257/E33.061 |
| 2013/0003346 A1 | 1/2013 | Letoquin et al. | |
| 2017/0345975 A1* | 11/2017 | Schmidt | H01L 33/502 |
| 2021/0017448 A1* | 1/2021 | Toyoshima | C09K 11/7734 |

FOREIGN PATENT DOCUMENTS

| | | |
|---|---|---|
| JP | 2020500958 A | 1/2020 |
| WO | 2018/087304 A1 | 5/2018 |
| WO | 2019/188319 A1 | 10/2019 |
| WO | WO2019188319 | * 10/2019 |

OTHER PUBLICATIONS

Li, Y.Q. (2005). Structure and luminescence properties of novel rare-earth doped silicon nitride based materials. Technische Universiteit Eindhove. https://doi.org/10.600/IR594350 (Year: 2005).

From the EPO as the ISA, Notification of Transmittal of the International Search Report and the Written Opinion of the International Searching Authority, or the Declaration, PCT/US2020/063385, Apr. 15, 2021, 10 pages.

The extended European search report corresponding to EP 20151188.8, dated Jul. 3, 2020, 4 pages.

Hoerder, Sr[Li2Al2O2N2]: Eu2+—A high performance red phosphor to brighten the future. Not Commun. 2019; 10: 1824. Published online Apr. 2, 20193 Year: 2019).

* cited by examiner

NARROW BAND EMITTING SIAION PHOSPHOR

CROSS REFERENCE TO RELATED APPLICATIONS

This application is a 371 national phase entry of International Application No. PCT/US2020/063385 filed Dec. 4, 2020. International Application No. PCT/US2020/063385 claims priority to U.S. patent application Ser. No. 17/110,080 filed Dec. 2, 2020; to U.S. Provisional Patent Application No. 62/944,025 filed Dec. 5, 2019; and to European Patent Application 20151188.8 filed Jan. 10, 2020. U.S. patent application Ser. No. 17/110,080 claims priority to U.S. Provisional Patent Application No. 62/944,025 filed Dec. 5, 2019, and to European Patent Application 20151188.8 filed Jan. 10, 2020. Each of the foregoing applications is incorporated herein by reference in its entirety.

FIELD OF THE INVENTION

The invention relates generally to phosphors and phosphor-converted light emitting diodes, and more particularly to narrow band emitting SiAlON phosphors, to methods for making them, to phosphor converted light emitting diodes comprising them, and to light emitting devices comprising such phosphor converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Phosphor converted LEDs that comprise narrow band red emitting phosphors of composition $A_{a-z}$-$B_b$-$C_c$-$X_x$:$Eu_z$ with A=(Sr,Ba,Ca,La,Lu); B=(Li,Mg); C=(Si,Al,B,Ga,P,Ge); X=(N,O,S,F,Cl); and $0.5 \leq c/x \leq 0.75$ showing for example an eightfold coordination of the activator ion by its ligands and activator contact lengths in the 210-320 pm range are disclosed in WO 2010/131133 A1. Examples of such Eu doped phosphor materials are for example homeotypic SrLiAl$_3$N$_4$:Eu (SLA) or SrLi$_2$Al$_2$O$_2$N$_2$:Eu (SLAO) disclosed in U.S. Pat. No. 9,546,319 B2 and WO 2018/087304 A1, respectively.

A known issue of such Eu doped phosphor materials is the tendency to incorporate the Eu activator not only in the preferred divalent state but also in the non-wanted trivalent state. An article entitled "Pressure-Controlled Synthesis of High-Performance SrLiAl$_3$N$_4$:Eu$^{2+}$ Narrow-Band Red Phosphors" by Fang et al. (J. Mater. Chem. C, 2018, DOI: 10.1039/C8TC03025A) teaches a process of elevating the gas pressure during the synthesis, leading to a slightly decreased unit cell volume, an increased quantum efficiency and an increased Eu$^{2+}$/Eu$^{3+}$ ratio, eventually enhancing the luminescence intensity of the SLA phosphor material.

The present inventors found however that phosphor materials like SLAO cannot be enhanced in their properties as is SLA by applying high process gas pressures. While in SLA the average alkaline earth cation size can only be decreased by replacing part of Sr (increased chemical pressure), the opposite has been observed by the present inventors for SLAO in which Ca alone is not soluble but the larger Ba atom (decreased chemical pressure) is. Since the lattice compressibility should show the same tendency as the unit cell volume change by cation substitution another Eu$^{2+}$ stabilization mechanism is needed to provide SLAO type phosphor materials with improved properties.

SUMMARY

This specification discloses methods of enhancing the stability and performance of Eu$^{2+}$ doped narrow band red emitting phosphors. In one embodiment the resulting phosphor compositions are characterized by crystallizing in ordered structure variants of the UCr$_4$C$_4$ crystal structure type and having a composition of $AE_{1-x}Li_{3-2y}Al_{1+y-z}Si_z$ $O_{4-4y-z}N_{4y+z}$:$Eu_x$ (AE=Ca, Sr, Ba or a combination thereof, $0 < x < 0.04$, $0 \leq y < 1$, $0 < z < 0.05$, $y+z \leq 1$). It is believed that the formal substitution $(Al,O)^+$ by $(Si,N)^+$ reduces the concentration of unwanted Eu$^{3+}$ and thus enhances properties of the phosphor such as stability and conversion efficiency.

One subgenus, with $y=\frac{1}{2}$, has composition $AE_{1-x}Li_2Al_{2-z}Si_zO_{2-z}N_{2+z}$:$Eu_x$.

Another subgenus, with $y=\frac{1}{2}$, has compositions characterized by the formula $Sr_{0.995-q}Ba_qLi_2Al_{1.995}Si_{0.005}O_{1.995}N_{2.005}$:$Eu_{0.005}$; $q>0$.

Preferably, the Si concentration in the host lattice of these novel phosphors is in about the same range as the Eu doping concentration.

These phosphor compositions may be viewed as a stabilized version of SLAO emitting in, for example, the 612-620 nm range with, for example, FWHM$\leq$55 nm. They are believed to solve the issue of a low operation lifetime of pcLEDs comprising a narrow band red emitting SLAO type phosphor by changing the defect chemistry of the SLAO material by addition of silicon to form novel SiAlON compositions that crystallize in the SLAO structure type.

The novel phosphor compositions disclosed in this specification may be employed, for example, in white light emitting pcLEDs, for example with color rendering index (CRI) of 90 or greater or of 80 or greater, and in red emitting pcLEDs. Phosphor converted LEDs comprising these phosphor compositions may be arranged as arrays. For example, microLED arrays may comprise these phosphor compositions.

Phosphor converted LEDs comprising these phosphor compositions, and arrays of such pcLEDs, may be employed, for example, in camera flash systems, automotive lighting, and display (e.g., augmented reality (AR) and virtual reality (VR)) technology. Arrays of pcLEDs in such systems may be configured to provide adaptive illumination.

The narrow band red emission provided by these phosphor compositions helps to minimize the light intensity distribution emitted in long wavelength spectral regions for which human eye sensitivity is low.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
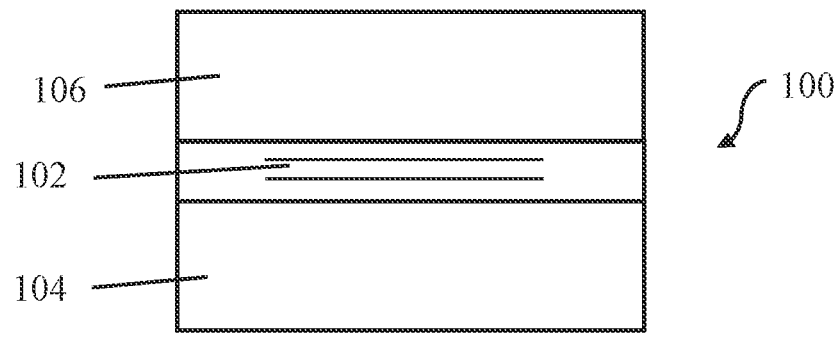
FIG. 1 shows a schematic cross-sectional view of an example pcLED.

FIG. 1 shows an example of an individual pcLED 100 comprising a light emitting semiconductor diode structure 102 disposed on a substrate 104, together considered herein an "LED", and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED, although this specification discloses novel phosphor compositions that may be advantageously employed.

Figure 2A:
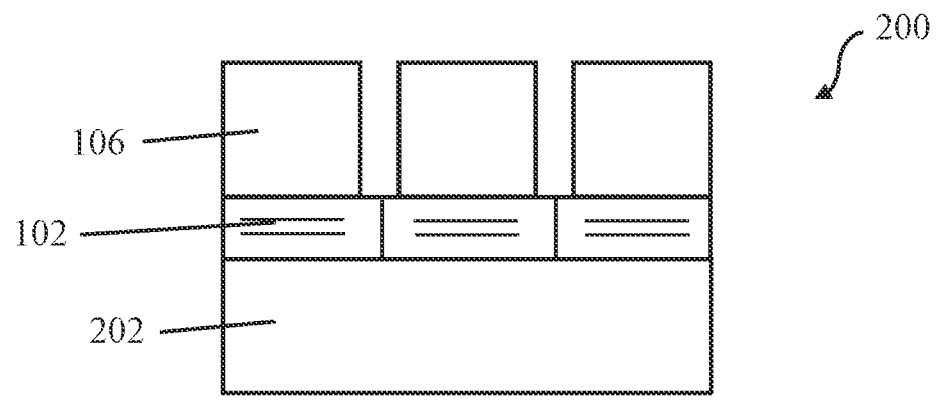
FIGS. 2A and 2B show, respectively, cross-sectional and top schematic views of an array of pcLEDs.
Figure 2B:
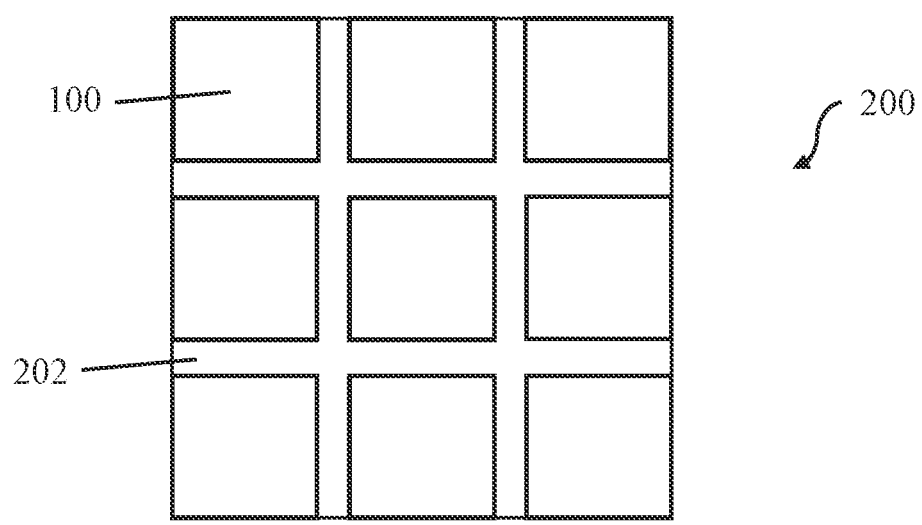

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Although FIGS. 2A-2B, show a three by three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape.

LEDs having dimensions in the plane of the array (e.g., side lengths) of less than or equal to about 50 microns are typically referred to as microLEDs, and an array of such microLEDs may be referred to as a microLED array.

Figure 2C:
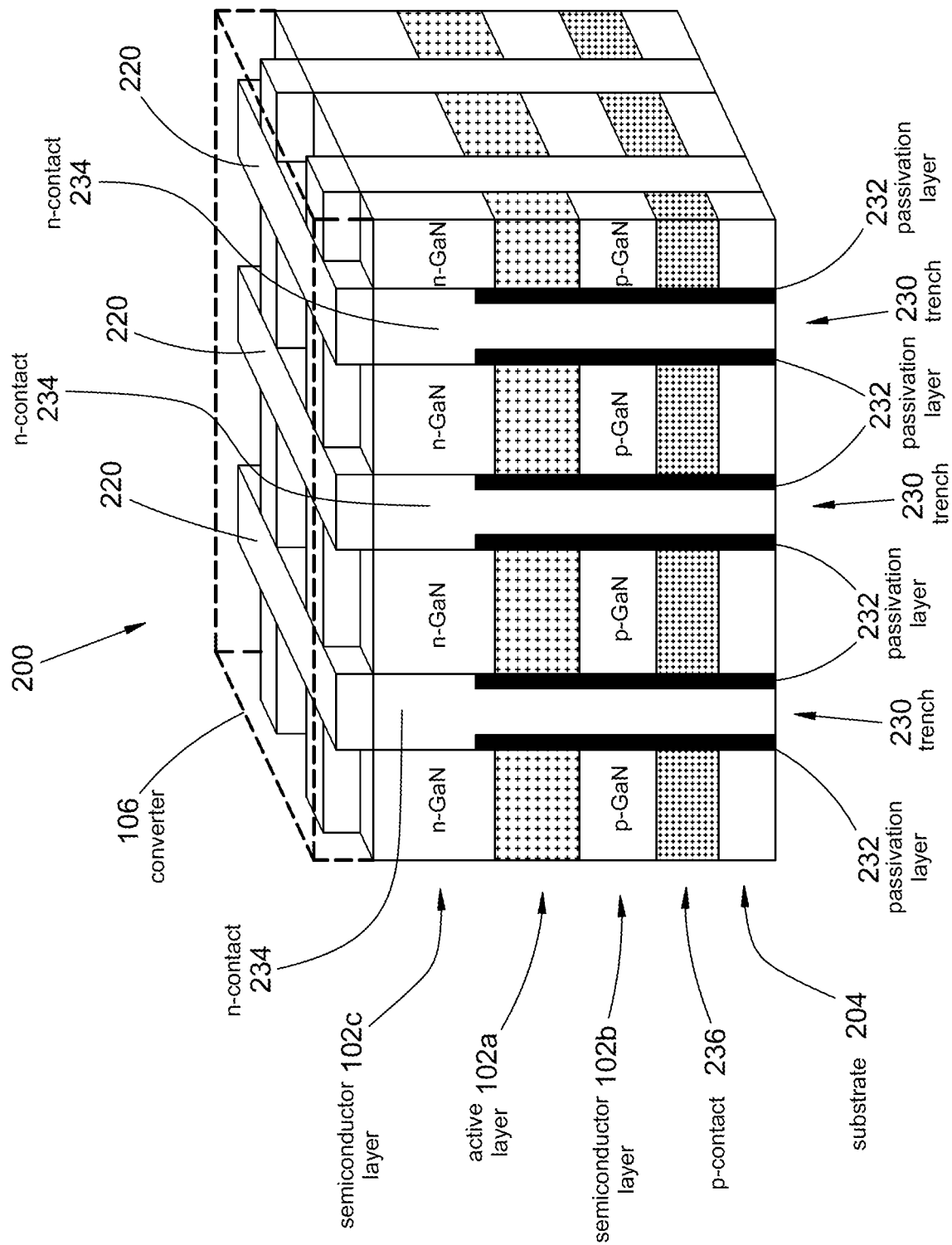
FIG. 2C Fig. shows a perspective view of several LEDs of an example pc miniLED or pc microLED array monolithically formed on a substrate.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure. FIG. 2C shows a perspective view of an example of such a segmented monolithic LED array 200. Pixels in this array (i.e., individual semiconductor LED devices 102) are separated by trenches 230 which are filled to form n contacts 234. The monolithic structure is grown or disposed on the substrate 204. Each pixel includes a p contact 236, a p GaN semiconductor layer 102b, an active region 102a, and an n GaN semiconductor layer 102c; the layers 102a/102b/102c collectively form the semiconductor LED 102. A wavelength converter material 106 may be deposited on the semiconductor layer 102c (or other applicable intervening layer).

Passivation layers 232 may be formed within the trenches 230 to separate at least a portion of the n contacts 234 from one or more layers of the semiconductor. The n contacts 234, other material within the trenches 230, or material different from material within the trenches 230 may extend into the converter material 106 to form complete or partial optical isolation barriers 220 between the pixels.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
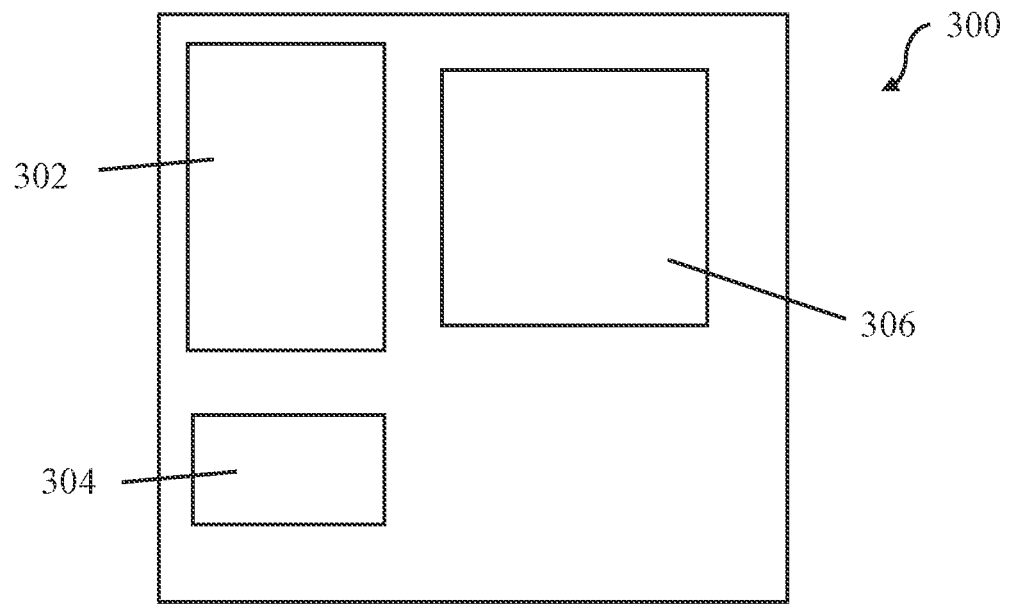
FIG. 3A shows a schematic top view of an electronics board on which an array of pcLEDs may be mounted, and FIG. 3B similarly shows an array of pcLEDs mounted on the electronic board of FIG. 3A.
Figure 3B:
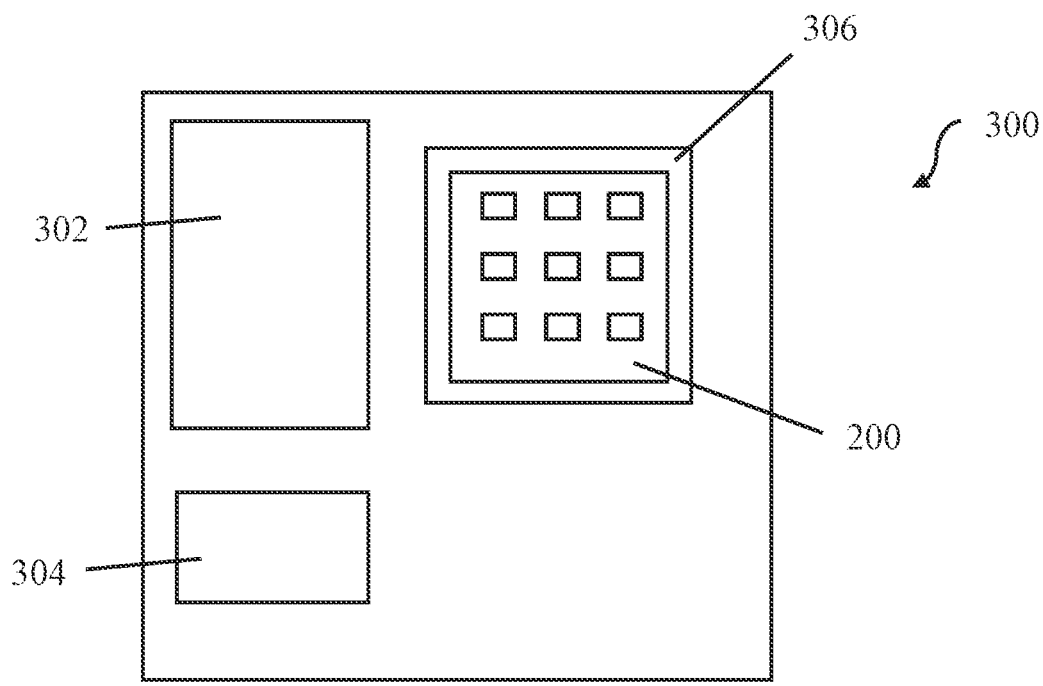

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
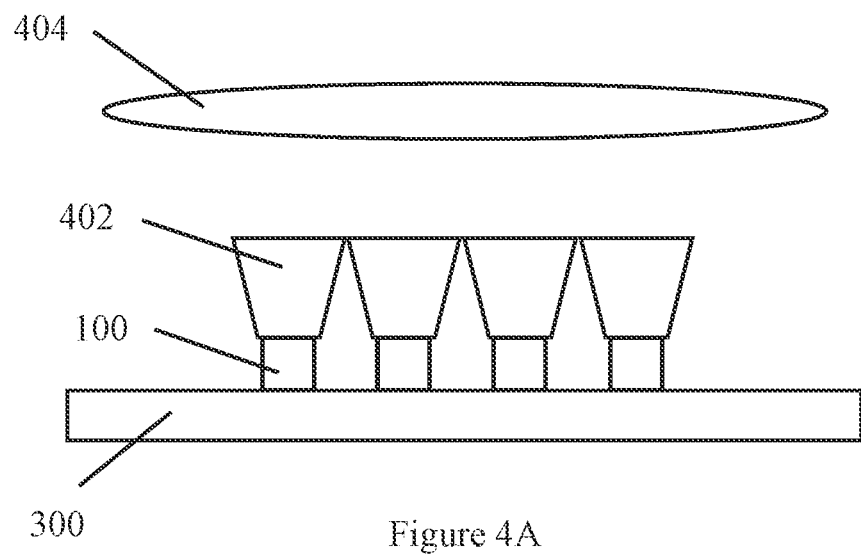
FIG. 4A shows a schematic cross sectional view of an array of pcLEDs arranged with respect to waveguides and a projection lens.
Figure 4B:
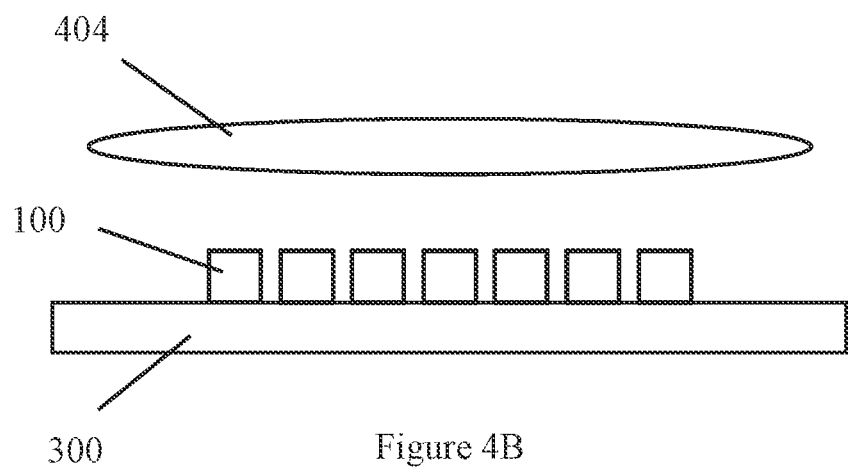
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications.

Figure 5:
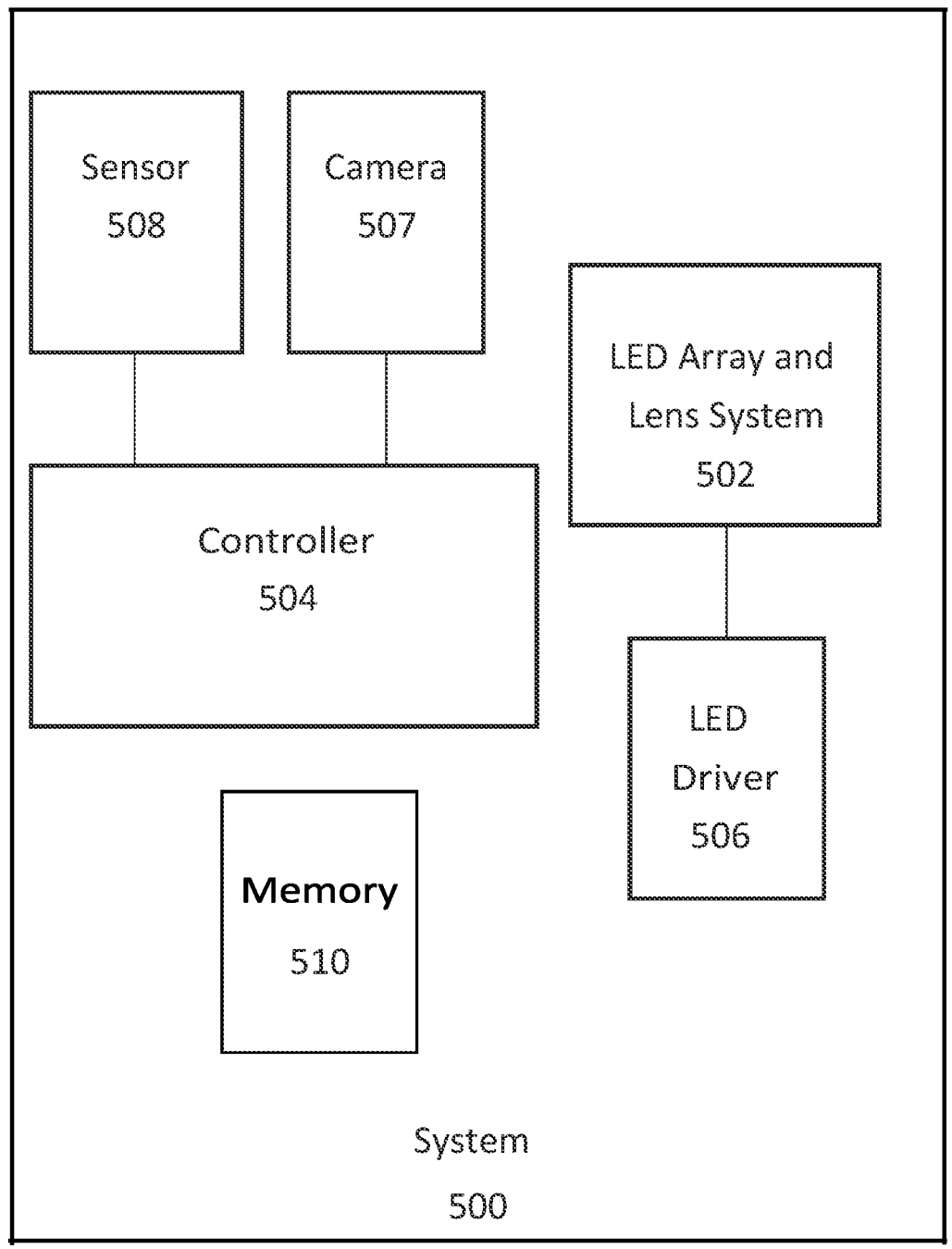
FIG. 5 schematically illustrates an example camera flash system comprising an adaptive illumination system.

FIG. 5 schematically illustrates an example camera flash system 500 comprising an LED array and lens system 502, which may be similar or identical to the systems described above. Flash system 500 also comprises an LED driver 506 that is controlled by a controller 504, such as a microprocessor. Controller 504 may also be coupled to a camera 507 and to sensors 508, and operate in accordance with instructions and profiles stored in memory 510. Camera 507 and adaptive illumination system 502 may be controlled by controller 504 to match their fields of view.

Sensors 508 may include, for example, positional sensors (e.g., a gyroscope and/or accelerometer) and/or other sensors that may be used to determine the position, speed, and orientation of system 500. The signals from the sensors 508 may be supplied to the controller 504 to be used to determine the appropriate course of action of the controller 504 (e.g., which LEDs are currently illuminating a target and which LEDs will be illuminating the target a predetermined amount of time later).

In operation, illumination from some or all of the pixels of the LED array in 502 may be adjusted—deactivated, operated at full intensity, or operated at an intermediate intensity. As noted above, beam focus or steering of light emitted by the LED array in 502 can be performed electronically by activating one or more subsets of the pixels, to permit dynamic adjustment of the beam shape without moving optics or changing the focus of the lens in the lighting apparatus.

Figure 6:
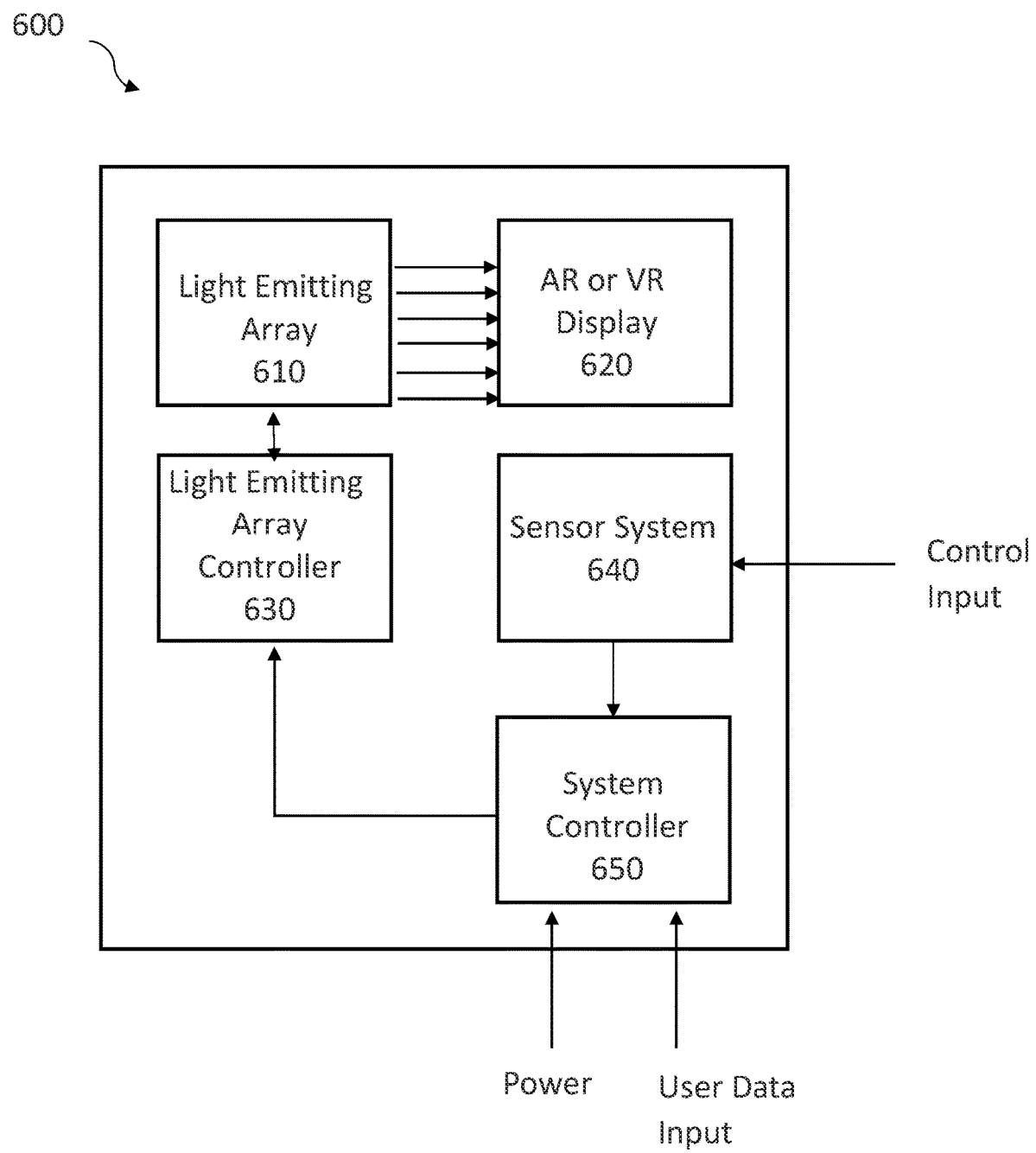
FIG. 6 schematically illustrates an example AR/VR system that includes an adaptive illumination system.

FIG. 6 schematically illustrates an example AR/VR system 600 that includes an adaptive light emitting array 610, AR or VR display 620, a light emitting array controller 630, sensor system 640, and system controller 650. Control input is provided to the sensor system 640, while power and user data input is provided to the system controller 650. In some embodiments modules included in the AR/VR system 600 can be compactly arranged in a single structure, or one or more elements can be separately mounted and connected via wireless or wired communication. For example, the light emitting array 610, AR or VR display 620, and sensor system 640 can be mounted on a headset or glasses, with the light emitting controller and/or system controller 650 separately mounted.

The light emitting array 610 may include one or more adaptive light emitting arrays, as described above, for example, that can be used to project light in graphical or object patterns that can support AR/VR systems. In some embodiments, arrays of microLEDs can be used.

The AR/VR system 600 can incorporate a wide range of optics in adaptive light emitting array 610 and/or AR/VR display 620, for example to couple light emitted by adaptive light emitting array 610 into AR/VR display 620.

Sensor system 640 can include, for example, external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As summarized above, this specification discloses novel phosphor compositions with superior luminescence properties compared to know phosphor compositions with isotypic crystal structures. The novel phosphor composition may be used in pcLEDs, arrays of pcLEDs, and devices employing such pcLEDs and arrays of pcLEDs as described above.

In particular, the inventors found that an improved SLAO type phosphor material can be obtained by co-doping the host lattice with Si to form SiAlON compounds. It is believed by the inventors that the formal substitution (Al, O)$^+$ by (Si,N)$^+$ reduces the concentration of unwanted Eu$^{3+}$ by increasing the concentration of the highly charged Si$^{4+}$ in the host lattice and thus enhances the stability and conversion efficiency of the phosphor material by suppressing the formation of Eu$^{3+}$ by oxidation of the Eu$^{2+}$ dopant. This is advantageous because a lower tendency to form unwanted Eu$^{3+}$ during operation of a phosphor converted LED comprising an SLAO type phosphor is desired to increase the reliability of such a device.

Specifically, in one embodiment the phosphor materials have composition $AE_{1-x}Li_{3-2y}Al_{1+2y-z}Si_zO_{4-4y-z}N_{4y+z}:Eu_x$ (AE=Ca, Sr, Ba; 0<x<0.04, 0.4<y<0.6, 0<z<0.05), where part of the aluminum of the host lattice is being replaced by silicon to form SiAlON type of formulations. To maintain charge neutrality of the host lattice also a part of the oxygen atoms are being replaced by nitrogen atoms. In other words, (Al,O)$^+$ pairs are being replaced charge neutral by (Si,N)$^+$ pairs in the phosphor host lattice.

The Si concentration should be in the range of the Eu activator concentration. If the activator concentration x is for example 0.005, the Si concentration should preferably be in the range 0.001 to 0.02, more preferably in the range 0.0025 to 0.015. More generally, referring to the formula above characterizing the phosphor composition, preferably $1/5 \leq z/x \leq 4$; more preferably $1/2 \leq z/x \leq 3$.

A preferred option to incorporate Si into the phosphor to form a SiAlON composition is via a nitride material such as for example silicon nitride. Even more preferred is the incorporation via $Eu_2Si_5N_8$ which also acts as Eu precursor with Eu in the divalent state and a Eu/Si ratio in the preferred range. The inventors found that $Eu_2Si_5N_8$ can be easily prepared from commercially available europium oxide, carbon and silicon nitride powders. $Eu_2Si_5N_8$ can be used as the only source of Eu dopant or it can be mixed with other sources like, for example, $Eu_2O_3$, $EuF_3$ or EuN.

In the following, examples for carrying out the invention are given.

Figure 7:
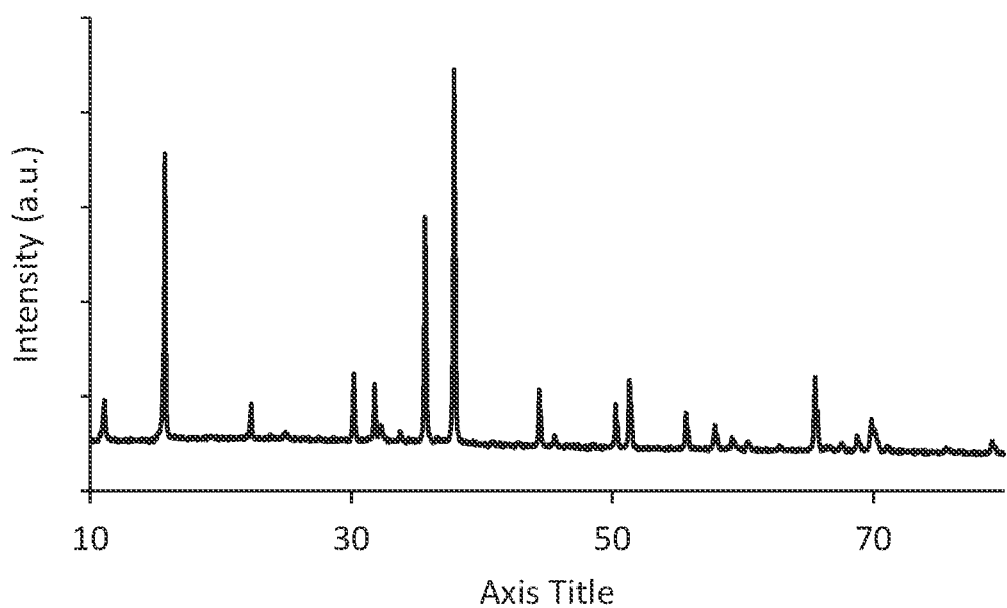
FIG. 7 shows a powder x-ray diffraction spectrum for the phosphor product of comparative Example A, $Sr_{0.995}Li_2Al_2O_2N_2{:}Eu_{0.005}$, described below.

Example A—Comparative example, synthesis of $Sr_{0.995}Li_2Al_2O_2N_2:Eu_{0.005}$. 30.312 g Strontium hydride (Materion, 99.5%), 17.202 g Lithium aluminum nitride prepared from Lithium nitride (Materion, 99.5%) and aluminum nitride (Tokuyama, grade F), 23.1746 g aluminum oxide (Baikowski, SP-DBM), 0.2988 g europium oxide (Neo, 4N), and 0.3733 g lithium fluoride (Aldrich, 99.99%) are mixed in a ball mill and fired at 730° C. setting temperature under nitrogen in a graphite furnace for 24 hrs. After ball milling in ethanol, the phosphor powder is dried and screened by sieving. FIG. 7 shows the x-ray diffraction (XRD) powder pattern of the powder product, indicating that it crystallizes in the tetragonal crystal structure of SLAO with lattice parameters $a_0$=7.950 Å and $c_0$=3.183 Å.

Figure 8:
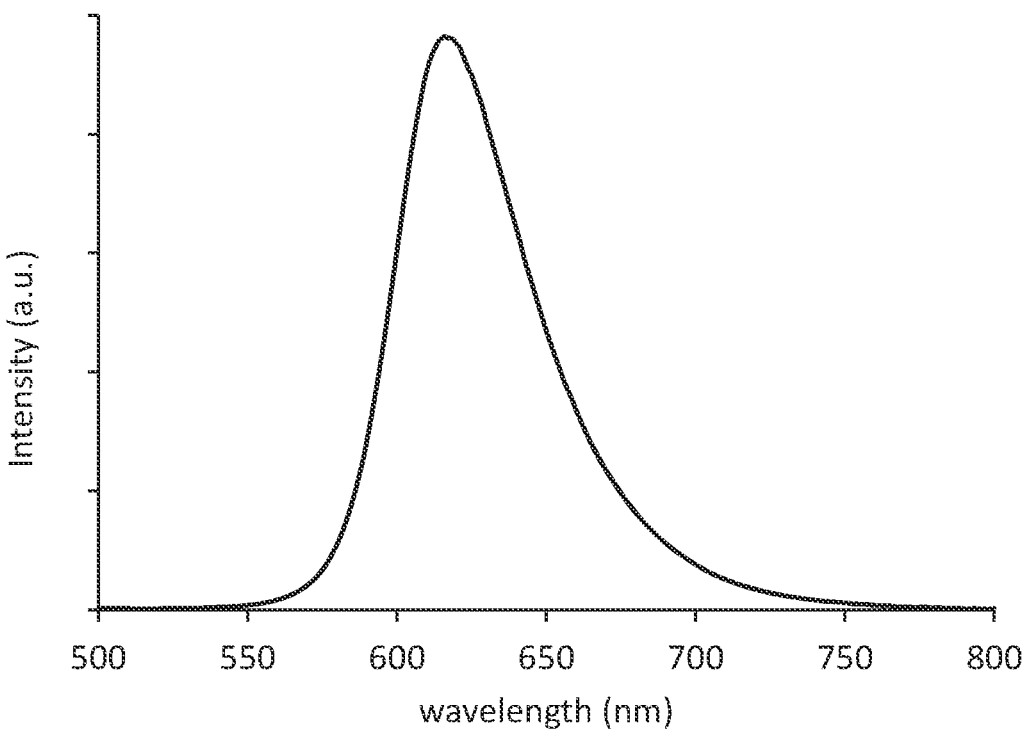
FIG. 8 shows an emission spectrum for the phosphor product of comparative Example A.
Figure 9:
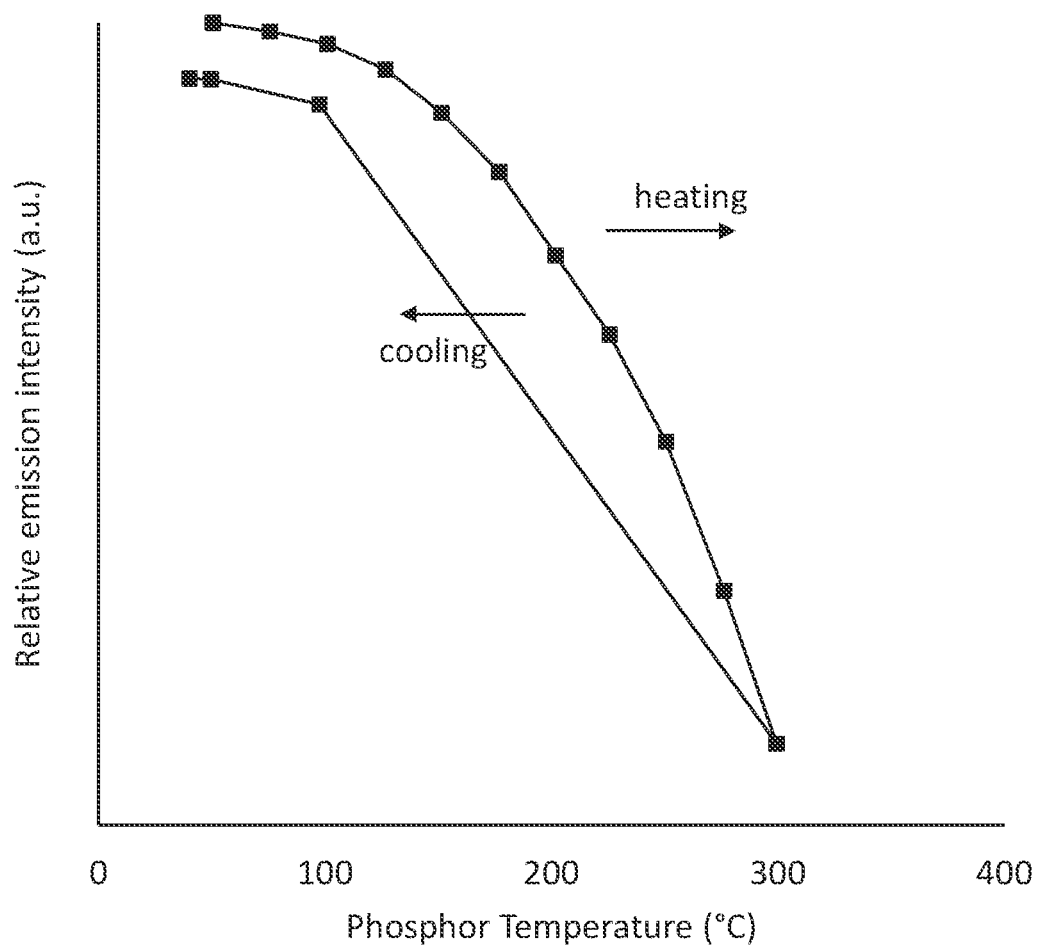
FIG. 9 shows the thermal behavior of the emission intensity of the phosphor product of comparative Example A.

The powder shows a peak emission at 618 nm with an emission half width of 53 nm if excited with 440 nm blue light (FIG. 8). The emission stability is assessed by heating a powder sample in air under 450 nm illumination and monitoring the emission intensity. The sample is first heated to 300° C. in 25K steps with 20 min dwell times and then cooled down. The drop in emission intensity with temperature is due to thermal quenching of the luminescence. After cooling down the emission signal is not fully recovered. FIG. 9 shows the relative emission intensity of the power sample as a function of the heating and cooling temperature. A 5% loss due to irreversible degradation is observed.

Figure 10:
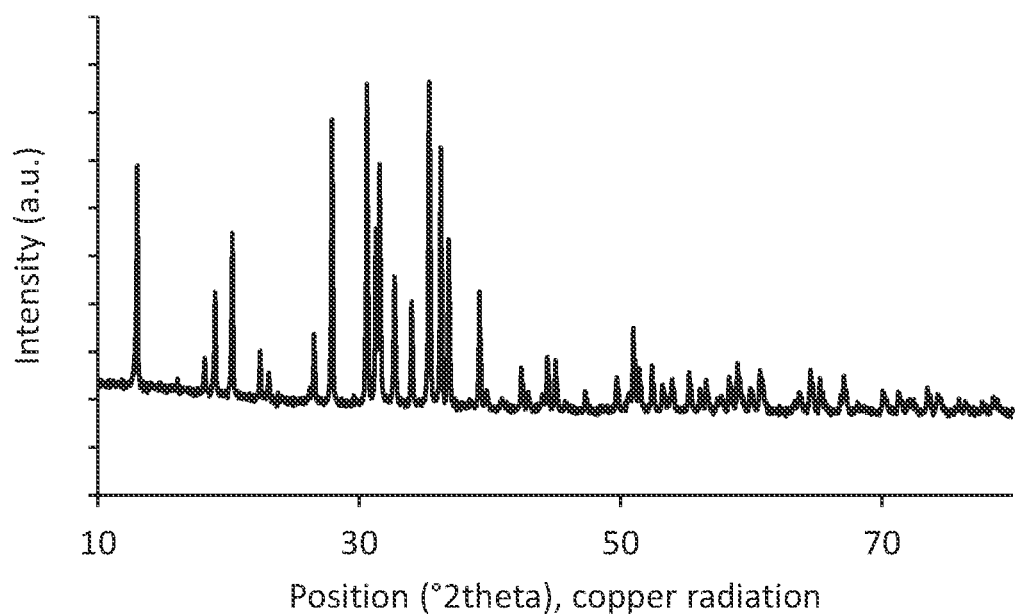
FIG. 10 shows a powder x-ray diffraction pattern for the synthesis product of Example B, reagent $Eu_2Si_5N_8$, described below.

Example B—Synthesis of $Eu_2Si_5N_8$. 37.3 g silicon nitride (UBE, >98.5%), 57.3 g europium oxide (NEO, 99.99%) and 6.45 g graphite (Alfa Aesar, microcrystal grade) are mixed by ball milling in cyclohexene, dried and transferred into a tube furnace. After firing at 1550° C. under a forming gas atmosphere (5% $H_2$, 95% $N_2$) for 8 h, the resulting $Eu_2Si_5N_8$ powder is ball milled in isopropanol and finally dried. FIG. 10 shows the XRD powder pattern of the $Eu_2Si_5N_8$ powder, indicating that it crystalizes in an orthorhombic lattice of the $Ba_2Si_5N_8$ structure type with cell constants $a_0$=5.7125 Å, $b_0$=6.793 Å, $c_0$=9.347 Å.

Figure 11:
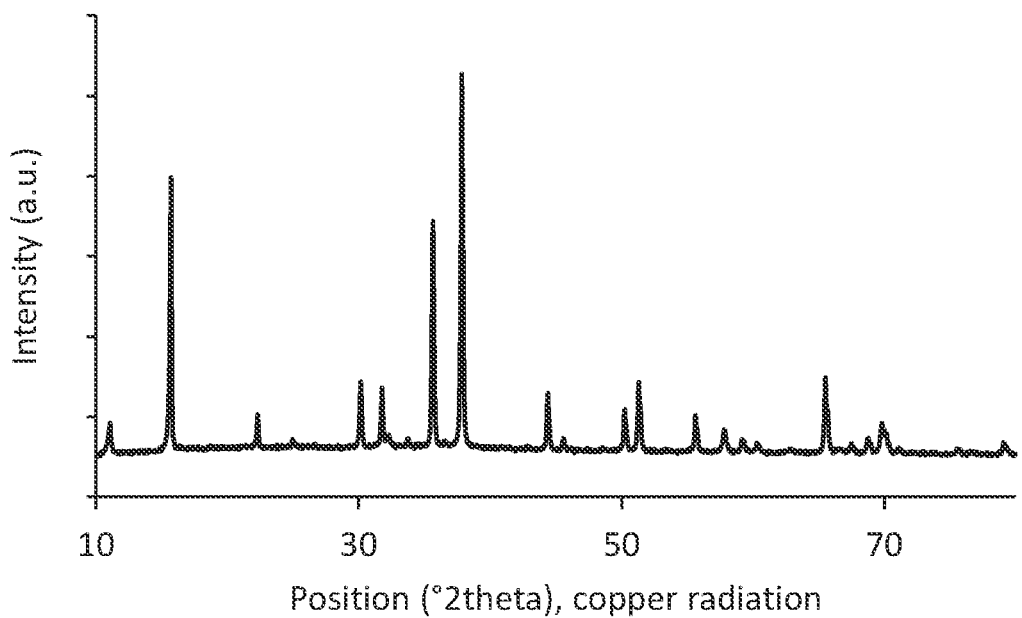
FIG. 11 shows a powder x-ray diffraction pattern for Example C, $Sr_{0.995}Li_2Al_2Si_{0.0125}O_{1.9875}N_{2.0125}{:}Eu_{0.005}$.

Example C—Synthesis of $Sr_{0.995}Li_2Al_2Si_{0.0125}O_{1.9875}N_{2.0125}:Eu_{0.005}$. 30.324 g Strontium hydride (Materion, 99.5%), 17.185 g Lithium aluminum nitride prepared from Lithium nitride (Materion, 99.5%) and aluminum nitride (Tokuyama, grade F), 23.111 g aluminum oxide (Baikowski, SP-DBM), 0.473 g europium nitridosilicate (from Example B), and 0.307 g lithium fluoride (Aldrich, 99.99%) are mixed in a ball mill and fired at 730° C. setting temperature under nitrogen in a graphite furnace for 24 hrs. After ball milling in ethanol, the phosphor powder is dried and screened by sieving. FIG. 11 shows the XRD powder pattern of the powder product, indicating that it crystallizes in the tetragonal crystal structure of SLAO with lattice parameters $a_0$=7.948 Å and $c_0$=3.185 Å.

Figure 12:
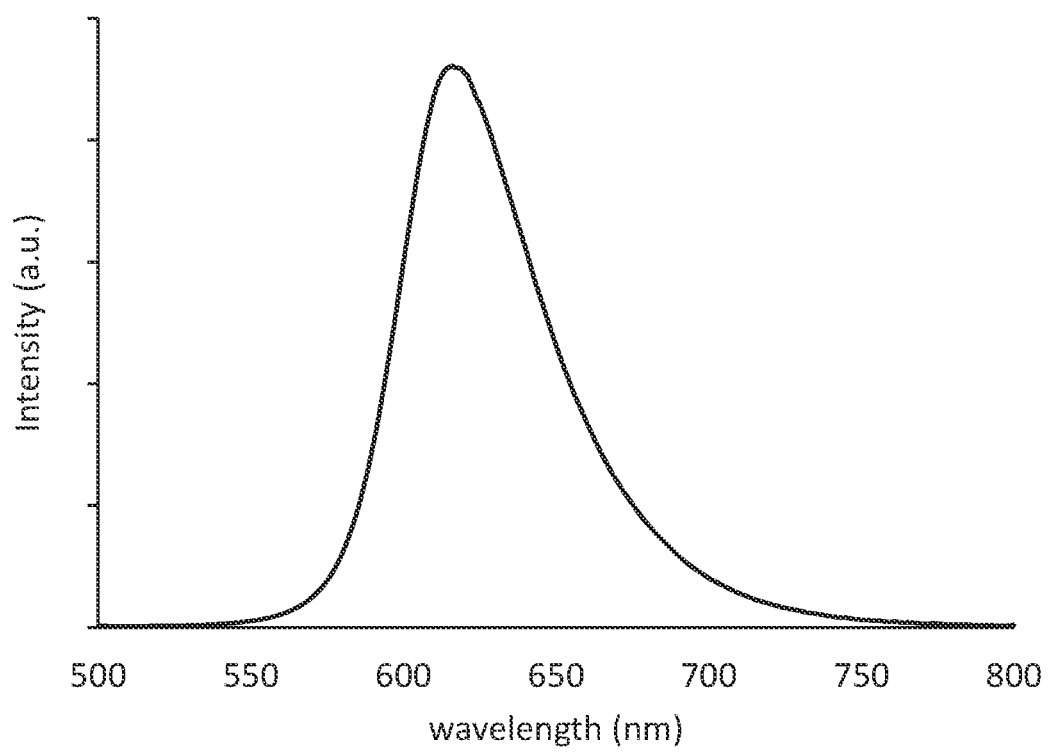
FIG. 12 shows an emission spectrum for the phosphor product of Example C.
Figure 13:
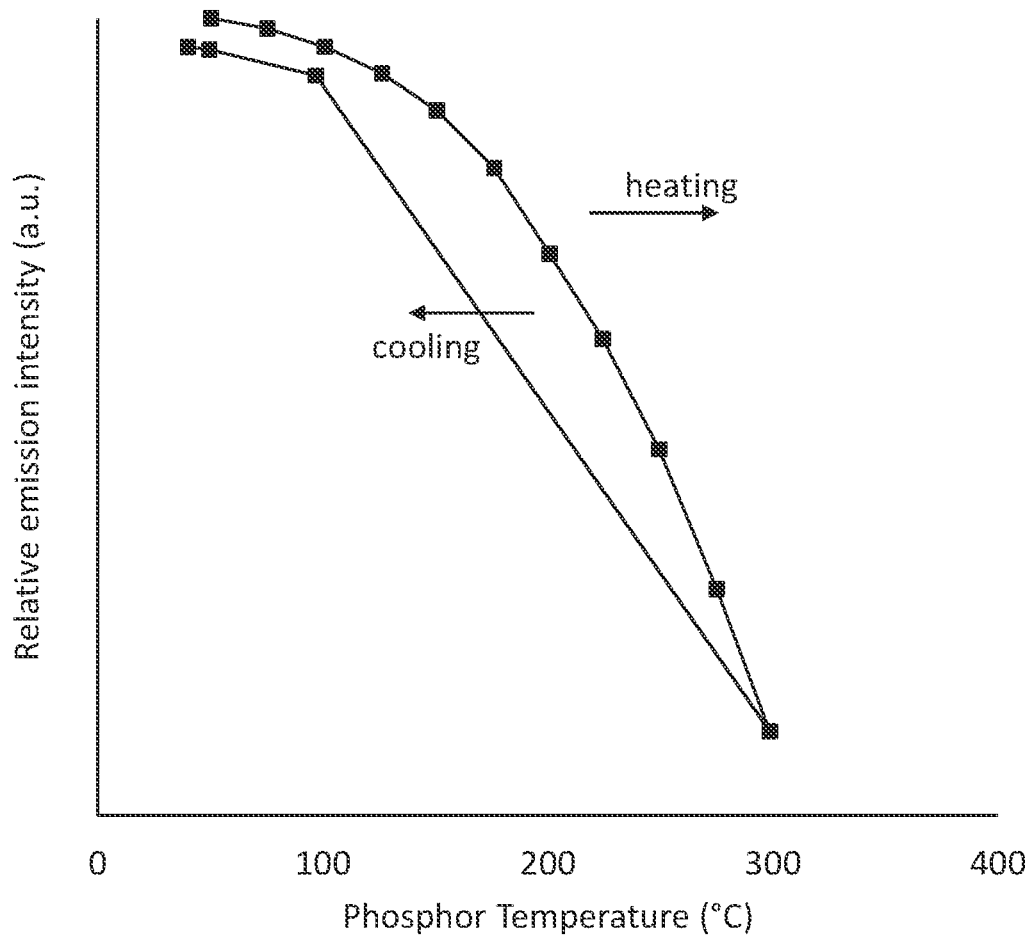
FIG. 13 shows the thermal behavior of the emission intensity of the phosphor product of Example C.

FIG. 12 shows the emission spectrum of the powder for 440 nm excitation wavelength. The emission shows a maximum at 616 nm and an emission half width of 54 nm. FIG. 13 shows the thermal behavior of the emission intensity of the powder for this example as measured with the same method as used for Example C. While the heating up part of the measurement is nearly identical with the one obtained for Example A, the irreversible degradation of the emission intensity is significantly lowered from 5% to 2%.

Example D—Comparative example, synthesis of $Sr_{1-x}Li_2Al_{2-z}Si_zO_{2-z}N_{2+z}:Eu_x$ by the method of WO2018087304. 4.703 g strontium nitride (Materion, 99.5%), 1.332 g aluminum nitride (Tokuyama, grade E), 3.314 g aluminum oxide (Baikowski, DBM), 1.132 g lithium nitride (Materion, 99.5%) and 0.043 g europium (III) oxide (NEO, 4N) are mixed by ball milling under inert atmosphere and fired in a Ni crucible at 800° C. setting temperature in a stream of forming gas (5% $H_2$ in nitrogen) for 288 hrs. The powder phosphor obtained is characterized by means of X-ray diffraction, luminescence measurements and high temperature storage lifetime testing as reported below.

Examples E1-E8, synthesis of $Sr_{1-x}Li_2Al_{2-z}Si_zO_{2-z}N_{2+z}:Eu_x$ with x=0.005, 0.01: z=0.005, 0.01, 0.02, 0.04. 119.22 g strontium hydride (Materion, 99.5%), 69.24 g lithium aluminum nitride (prepared by mixing of $Li_3N$ (Materion, 99.5%) and aluminum nitride (Tokuyama, grade E) and firing the mixture at 800° C. in nitrogen atmosphere followed by ball milling), 92.46 g aluminum oxide (Baikowski, DBM) and 0.378 g europium nitridosilicate (prepared according to example B) are mixed by ball milling under cyclohexane and drying in vacuum at 50° C.

The mixed powder is divided into 33.142 g samples and mixed with silicon nitride (UBE, SN-E10), lithium nitride (Materion, 99.5%) and a fluoride mixture consisting of aluminum fluoride (Alfa Aesar, anhydrous), strontium fluoride (Alfa Aesar, anhydrous) and lithium fluoride (Merck, p.a.) in a molar ratio Al:Sr:Li=1:1:3 according to the following Table 1.

TABLE 1

| Example | powder mix [g] | $Eu_2Si_5N_8$ [g] | $Eu_2O_3$ [g] | $Si_3N_4$ [g] | $Li_3N$ [g] | fluorides [g] | x | z |
|---|---|---|---|---|---|---|---|---|
| E1 | 33.142 | — | 0.084 | — | 0.166 | 0.497 | 0.005 | 0.005 |
| E2 | 33.142 | 0.089 | 0.028 | — | 0.166 | 0.497 | 0.005 | 0.01 |
| E3 | 33.142 | 0.134 | — | 0.056 | 0.166 | 0.497 | 0.005 | 0.02 |
| E4 | 33.142 | 0.134 | — | 0.206 | 0.166 | 0.497 | 0.005 | 0.04 |
| E5 | 33.142 | — | 0.230 | — | 0.166 | 0.497 | 0.010 | 0.005 |
| E6 | 33.142 | 0.089 | 0.169 | — | 0.166 | 0.497 | 0.010 | 0.01 |
| E7 | 33.142 | 0.267 | 0.060 | — | 0.166 | 0.497 | 0.010 | 0.02 |
| E8 | 33.142 | 0.356 | — | 0.112 | 0.166 | 0.497 | 0.010 | 0.04 |

After mixing, the samples were fired twice at 710° C. and 730° C., respectively under nitrogen atmosphere with intermediate milling. After cooling to room temperature and dry ball milling, each sample was treated with 200 ml of a 50 wt % solution of triethylene glycol (Merck) in ethanol with a total water content of 100 ppm for 12 hrs at 80° C., washed with ethanol and dried. After drying the phosphor powder samples were re-dispersed in ethanol, milled with yttria stabilized zirconia milling media and screened by sedimentation. 10 g of each phosphor sample was then mixed with 55 ml ethanol, 170 μm tetraethoxysilane (Aldrich) and 4.5 ml of a 25% aqueous ammonia solution. After stirring for 30 min, the powders were removed from the solution by filtering, dried in a vacuum furnace at 300° C. and characterized.

The following Table 2 shows the lattice constants of all samples that crystallize in the tetragonal SLAO structure type.

TABLE 2

| Example | $a_0$ [Å] | $c_0$ [Å] | V [Å³] |
|---|---|---|---|
| E1 | 7.9561 | 3.1814 | 503.61 |
| E2 | 7.9543 | 3.1812 | 503.27 |
| E3 | 7.9539 | 3.1825 | 503.20 |
| E4 | 7.9519 | 3.1831 | 502.83 |
| E5 | 7.9556 | 3.1820 | 503.53 |
| E6 | 7.9548 | 3.1822 | 503.37 |
| E7 | 7.9539 | 3.1833 | 503.21 |
| E8 | 7.9525 | 3.1840 | 502.94 |
| D | 7.9799 | 3.1824 | 508.14 |

The luminescence properties of the samples were measured from thick powder layers. The following Table 3 summarizes the findings. TQ (50%) is the temperature at which the emission intensity reaches 50% of the room temperature value, Rel. light output is the emission intensity after treating the samples at 400° C. for 2 hrs under ambient atmosphere.

TABLE 3

| Example | int. QE [%] | CIE Color Point x | CIE Color Point y | reflectance (440 nm) [%] | emission max. [nm] | emission FWHM [nm] | TQ (50%) [° C.] | Rel. light output (2 h, 400° C.) |
|---|---|---|---|---|---|---|---|---|
| E1 | 272 | 0.663 | 0.335 | 32 | 618 | 53 | 280 | 0.557 |
| E2 | 284 | 0.663 | 0.337 | 35 | 618 | 53 | 275 | 0.547 |
| E3 | 300 | 0.663 | 0.336 | 37 | 619 | 57 | 262 | 0.513 |
| E4 | 296 | 0.661 | 0.339 | 43 | 618 | 57 | 263 | 0.438 |
| E5 | 268 | 0.674 | 0.326 | 17 | 624 | 69 | 238 | 0.536 |
| E6 | 280 | 0.671 | 0.329 | 23 | 622 | 67 | 237 | 0.457 |
| E7 | 288 | 0.672 | 0.327 | 22 | 624 | 74 | 216 | 0.450 |
| E8 | 288 | 0.672 | 0.328 | 25 | 626 | 80 | 209 | 0.415 |
| D | 100 | 0.655 | 0.343 | 47 | 616 | 52 | 294 | 0.207 |

Figure 14A:
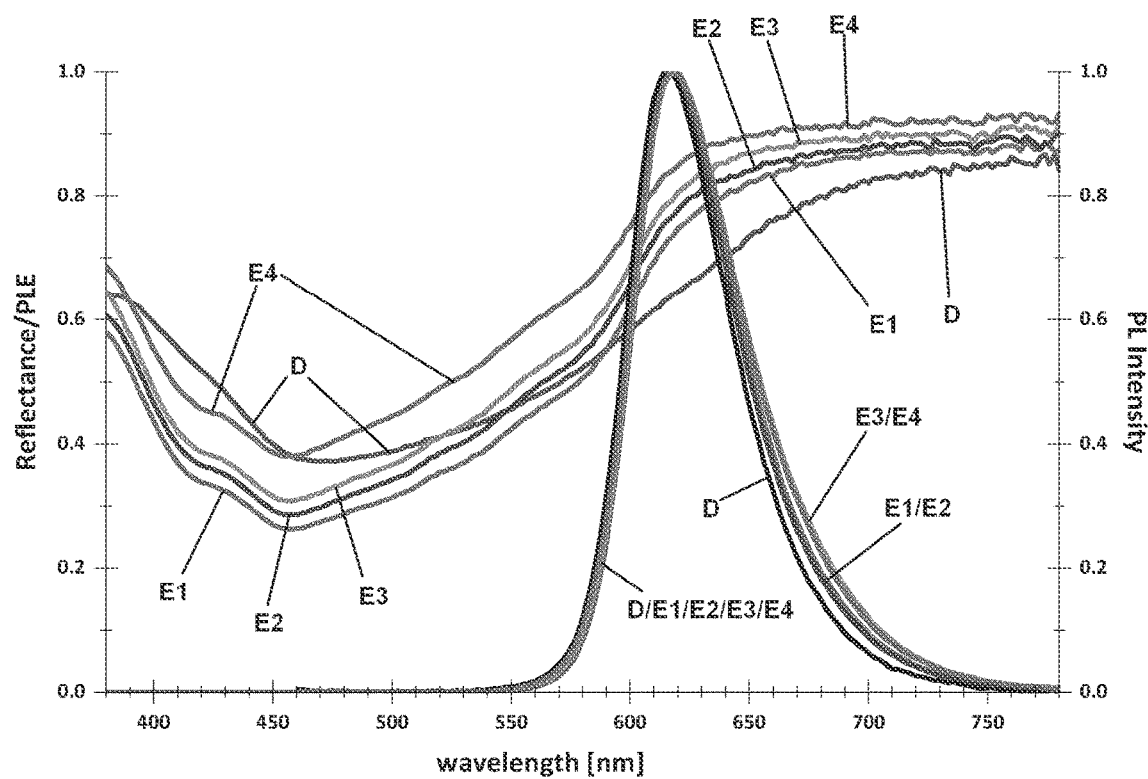
FIG. 14A shows photoluminescence excitation (PLE) spectra and photoluminescence emission spectra for the phosphor products of comparative Example D and Examples E1-E4.
Figure 15A:
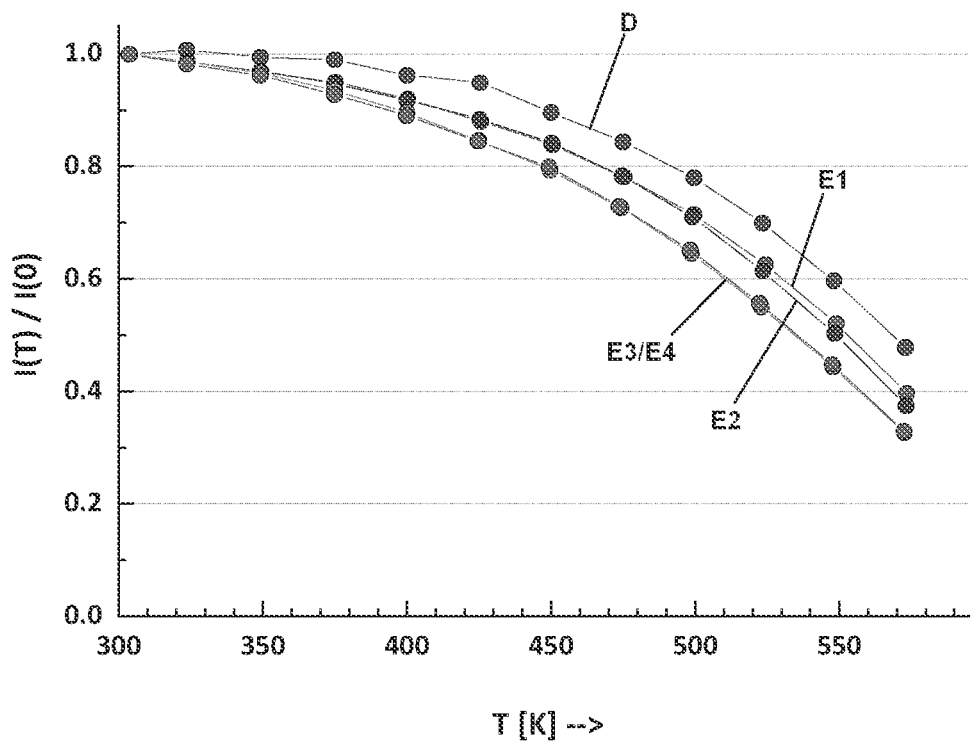
FIG. 15A shows the thermal behavior of the emission intensity of the phosphor products of comparative Example D and Examples E1-E4.

FIG. 14A shows photoluminescence excitation (PLE) spectra and photoluminescence emission spectra for the phosphor products of comparative Example D and Examples E1-E4. FIG. 15A shows the thermal quenching of emission for the same phosphors. The phosphors of Examples E1-E4 have an Eu subscript of x=0.005.

Figure 14B:
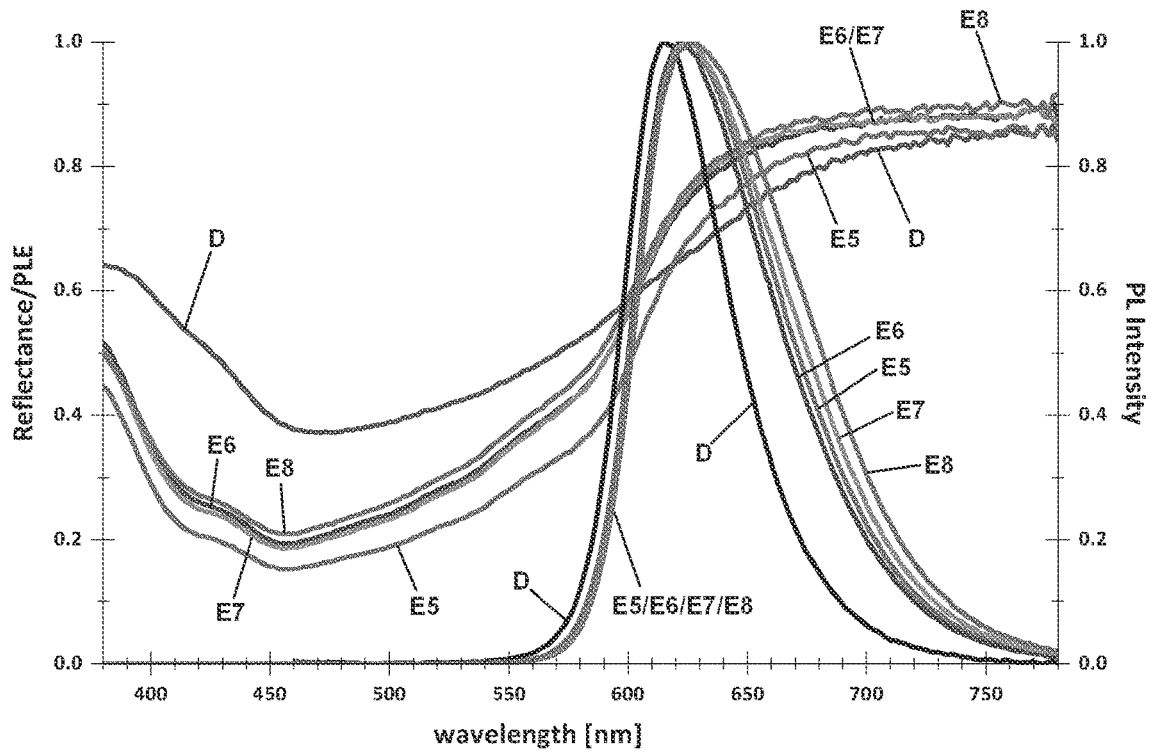
FIG. 14B shows photoluminescence excitation (PLE) spectra and photoluminescence emission spectra for the phosphor products of comparative Example D and Examples E5-E8.
Figure 15B:
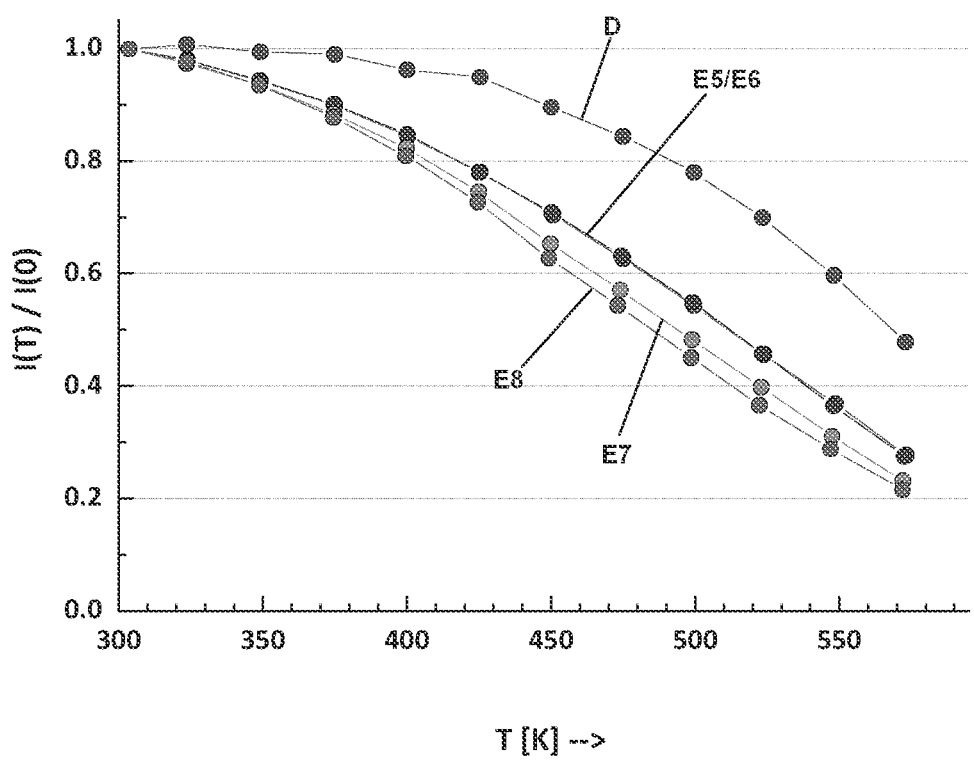
FIG. 15B shows the thermal behavior of the emission intensity of the phosphor products of comparative Example D and Examples E5-E8.

FIG. 14B shows photoluminescence excitation (PLE) spectra and photoluminescence emission spectra for the phosphor products of comparative Example D and Examples E5-E8. FIG. 15B shows the thermal quenching of emission for the same phosphors. The phosphors of Examples E5-E8 have an Eu subscript of x=0.01.

Examples F1-F2: Synthesis of $Sr_{0.995-q}Ba_qLi_2Al_{1.995}Si_{0.005}O_{1.995}N_{2.005}:Eu_{0.005}$ with q=0.1, 0.2

Example F1: 27.28 g strontium hydride (Materion, 99.5%), 4.74 g barium hydride (Materion, 99.7%), 17.19 g lithium aluminum nitride (prepared by mixing of $Li_3N$ (Materion, 99.5%) and aluminum nitride (Tokuyama, grade E) and firing the mixture at 800° C. in nitrogen atmosphere followed by ball milling), 0.592 g lithium nitride (Materion, 99.5%), 23.03 g aluminum oxide (Baikowski, 99.9%), 0.175 g of a 70:30 mixture of LiCl and LiF (both Merck, p.a.), 0.19 g europium nitridosilicate (prepared according to example B) and 0.18 g europium oxide (NEO, 4N) are mixed by ball milling under cyclohexane and drying in vacuum at 50° C. The powder mixture is fired at 730° C. under forming gas atmosphere for 30 hours followed by cooling to room temperature and milling for 10 min in a planetary ball mill. The powder sample was treated with 200 ml of a 50 wt % solution of triethylene glycol (Merck) in ethanol with a total water content of 100 ppm for 12 hrs at 80° C., washed with ethanol and dried to obtain sample F1.

Example F2: 24.23 g strontium hydride (Materion, 99.5%), 9.48 g barium hydride (Materion, 99.7%), 17.19 g lithium aluminum nitride (prepared by mixing of $Li_3N$ (Materion, 99.5%) and aluminum nitride (Tokuyama, grade E) and firing the mixture at 800° C. in nitrogen atmosphere followed by ball milling), 0.592 g lithium nitride (Materion, 99.5%), 23.03 g aluminum oxide (Baikowski, 99.9%), 0.175 g of a 70:30 mixture of LiCl and LiF (both Merck, p.a.), 0.19 g europium nitridosilicate (prepared according to example B) and 0.18 g europium oxide (NEO, 4N) are mixed by ball milling under cyclohexane and drying in vacuum at 50° C. The powder mixture is fired at 730° C. under forming gas atmosphere for 30 hrs followed by cooling to room temperature and milling for 10 min in a planetary ball mill. The powder sample was treated with 200 ml of a 50 wt % solution of triethylene glycol (Merck) in ethanol with a total water content of 100 ppm for 12 hrs at 80° C., washed with ethanol and dried to obtain sample F2.

Figure 16:
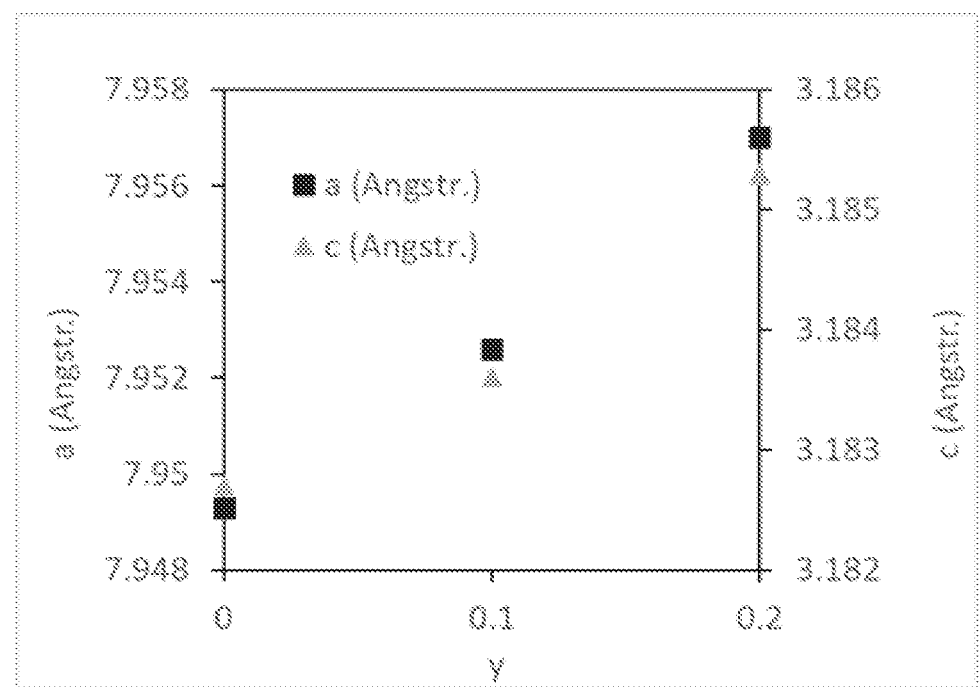
FIG. 16 shows lattice constants for $Sr_{0.995-q}Ba_qLi_2Al_{1.995}Si_{0.005}O_{1.995}N_{2.005}{:}Eu_{0.005}$ for q=0, q=0.1, and q=0.2.

Both examples F1 and F2 crystallize in the tetragonal crystal structure of SLAO with the lattice constants shown in FIG. 16. The reference example for q=0 has been synthesized without Ba addition. The following Table 4 summarizes the spectroscopic properties of samples F1 and F2.

TABLE 4

| Example | int. QE [%] | CIE Color Point x | CIE Color Point y | reflectance (440 nm) [%] | emission max. [nm] | emission FWHM [nm] | TQ (50%) [° C.] |
|---|---|---|---|---|---|---|---|
| F1 | 342 | 0.663 | 0.337 | 35 | 618 | 55 | 280 |
| F2 | 340 | 0.663 | 0.336 | 41 | 618 | 56 | 284 |

Figure 17A:
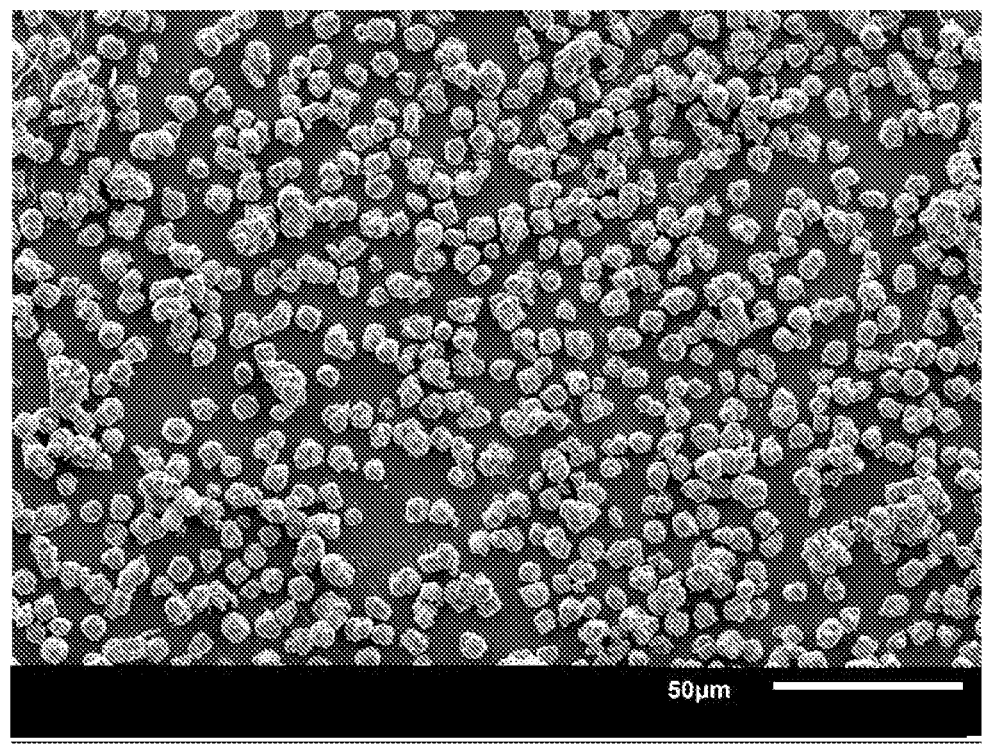
FIG. 17A shows an SEM image of particles of sample F1.
Figure 17B:
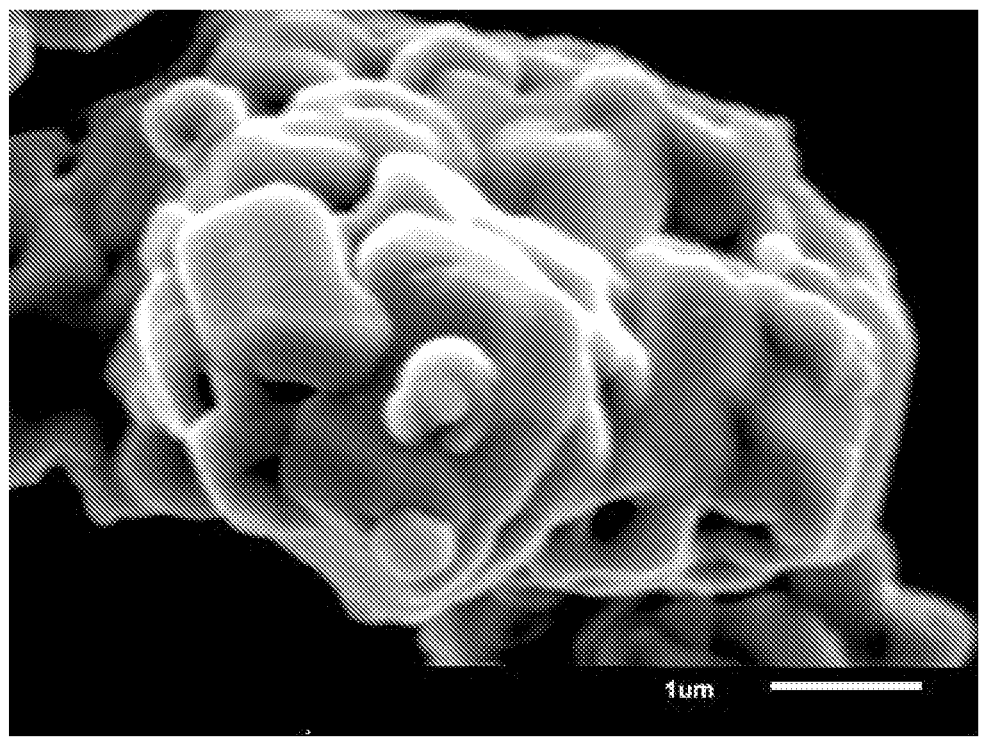
FIG. 17B shows an SEM image of a single particle of sample F1.
Figure 17C:
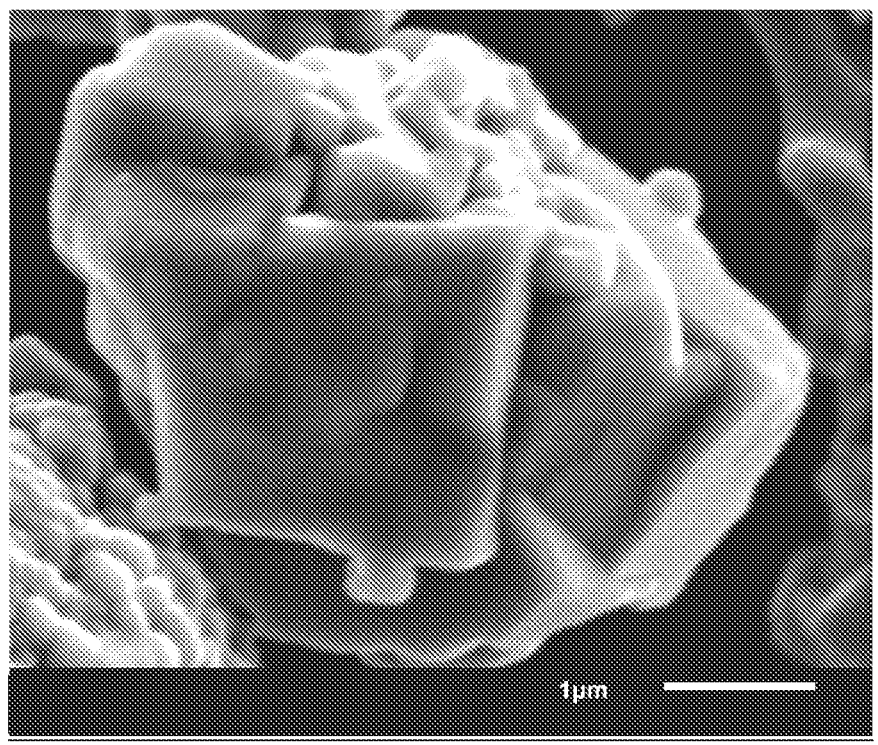
FIG. 17C shows an SEM image of a single particle of sample F2.

FIGS. 17A-17C show scanning electron micrograph (SEM) images of particles of sample F1 and sample F2. Both samples show a narrow particle size distribution with an average particle size of about 7 microns. FIG. 17A shows an SEM image of particles of sample F1. FIG. 17B shows an SEM image of a single particle of sample F1. FIG. 17C shows an SEM image of a single particle of sample F2.

This disclosure is illustrative and not limiting. Further modifications will be apparent to one skilled in the art in light of this disclosure and are intended to fall within the scope of the appended claims.

The invention claimed is:

1. A luminescent composition of matter characterized by the formula:

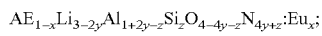

AE=Ca,Sr,Ba, or a combination thereof;

0<x<0.04;

0.4<y<0.6; and

0<z<0.05, the luminescent composition of matter having a tetragonal crystal structure.

2. The luminescent composition of matter of claim 1, wherein y is equal to or about equal to 0.5.

3. The luminescent composition of matter of claim 1 characterized by the formula $AE_{1-x}Li_2Al_{2-z}Si_zO_{2-z}N_{2+z}:Eu_x$.

4. The luminescent composition of matter of claim 3, wherein AE=Sr.

5. The luminescent composition of matter of claim 1 characterized by the formula:

q>0.

6. The luminescent composition of matter of claim 1, wherein the crystal structure is a variant of the $UCr_4C_4$ type structure.

7. The luminescent composition of matter of claim 1, emitting light with an emission peak having a peak wavelength in the range 612 nm to 620 nm and a full width at half maximum≤55 nm.

8. The luminescent composition of matter of claim 1, wherein 1/5≤z/x≤8.

9. The luminescent composition of matter of claim 8, wherein 1/5≤z/x≤4.

10. The luminescent composition of matter of claim 9, wherein 1/2≤z/x≤3.

11. The luminescent composition of matter of claim 1 wherein y is equal to or about equal to 0.5, and the crystal structure is a variant of the $UCr_4C_4$ type structure.

12. The luminescent composition of matter of claim 11, emitting light with an emission peak having a peak wavelength in the range 612 nm to 620 nm and a full width at half maximum≤55 nm.

13. The luminescent composition of matter of claim 12, wherein 1/5≤z/x≤8.

14. The luminescent composition of matter of claim 13, wherein 1/5≤z/x≤4.

15. A method for making the luminescent composition of matter of claim 1, comprising reacting $Eu_2Si_5N_8$ with additional reagents.

16. A light emitting device comprising:
   a semiconductor light emitting device; and
   a phosphor composition comprising the luminescent composition of matter of claim 1 positioned to absorb light emitted by the semiconductor light emitting device and in response emit light of a longer wavelength.

17. The light emitting device of claim 16, wherein a combined light output from the semiconductor light emitting device and the phosphor composition is perceived as white by a human with normal color vision, where the combined light output is characterized by a CRI of 80 or greater.

18. An adaptive illumination system comprising:
   an array of independently controllable pcLEDs at least some of which comprise the luminescent composition of matter of claim 1; and
   a lens or lens system arranged to collimate or partially collimate light emitted by the pcLEDs.

19. A mobile device comprising:
   a camera; and
   a flash illumination system comprising:
      a monolithic array of independently controllable pcLEDs at least some of which comprise the luminescent composition of matter of claim 1; and
      a lens or lens system spaced apart from the array of LEDs and arranged to direct light emitted by the pcLEDs into a field of view of the camera.

20. A display system comprising:
a display;
a monolithic array of independently controllable pcLEDs at least some of which comprise the luminescent composition of matter of claim 1; and
a lens or lens system spaced apart from the array of LEDs and arranged to couple light from the array of LEDs into the display.

\* \* \* \* \*